United States Patent
Badia

(10) Patent No.: US 10,292,222 B2
(45) Date of Patent: May 14, 2019

(54) CONTROL DEVICE FOR THE ELECTRICAL POWER SUPPLY FOR A SEMICONDUCTOR LIGHT SOURCE

(71) Applicant: VALEO VISION, Bobigny (FR)

(72) Inventor: Olivier Badia, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/886,933

(22) Filed: Feb. 2, 2018

(65) Prior Publication Data

US 2018/0220503 A1 Aug. 2, 2018

(30) Foreign Application Priority Data

Feb. 2, 2017 (FR) ..................................... 17 50854

(51) Int. Cl.
  *H05B 33/08* (2006.01)
  *H05B 37/02* (2006.01)
  *H01L 23/552* (2006.01)
  *H05K 1/02* (2006.01)
  *H05K 9/00* (2006.01)
  *H05K 5/00* (2006.01)

(52) U.S. Cl.
  CPC ....... *H05B 33/0842* (2013.01); *H01L 23/552* (2013.01); *H05B 33/0809* (2013.01); *H05B 37/02* (2013.01); *H05K 1/0218* (2013.01); *H05K 5/006* (2013.01); *H05K 9/0039* (2013.01); *H05K 9/0084* (2013.01)

(58) Field of Classification Search
  None
  See application file for complete search history.

(56) References Cited

U.S. PATENT DOCUMENTS

| 6,031,732 A | 2/2000 | Koike et al. |
| 6,191,475 B1 * | 2/2001 | Skinner ................. H01L 23/552 |
| | | 174/255 |
| 6,612,720 B1 * | 9/2003 | Beadle .................... F21V 17/02 |
| | | 362/287 |

(Continued)

FOREIGN PATENT DOCUMENTS

FR     2 933 567 A1    1/2010

OTHER PUBLICATIONS

French Preliminary Search Report dated Oct. 17, 2017 in French Application 17 50854 filed on Feb. 2, 2017 (with English Translation of Categories of Cited Documents).

*Primary Examiner* — Jany Richardson
(74) *Attorney, Agent, or Firm* — Oblon, McClelland, Maier & Neustadt, L.L.P.

(57) ABSTRACT

A control device for the electrical power supply for a semiconductor light source for a light module includes a printed circuit board including at least one electronic component for controlling the electrical power supply. Also provided is a housing suitable for accommodating the printed circuit board, and a protective cap for closing said housing. A first ground belt is arranged on a first face of the printed circuit board and a second ground belt is arranged on a second face of the printed circuit board opposite the first face. The housing includes first points of contact with the second ground belt and the protective cap including second points of contact with the first ground belt, the housing and/or the protective cap including at least one protective curb for all or part of the first and second points of contact.

20 Claims, 8 Drawing Sheets

(56) References Cited

U.S. PATENT DOCUMENTS

| | | | |
|---|---|---|---|
| 6,624,432 B1* | 9/2003 | Gabower | H04B 1/3838 |
| | | | 174/384 |
| 2015/0092437 A1* | 4/2015 | Arita | F21V 15/01 |
| | | | 362/546 |

* cited by examiner

CONTROL DEVICE FOR THE ELECTRICAL POWER SUPPLY FOR A SEMICONDUCTOR LIGHT SOURCE

TECHNICAL FIELD OF THE INVENTION

The present invention relates to a control device for the electrical power supply for a semiconductor light source.

It is particularly but not exclusively applicable into light modules for motor vehicles.

TECHNOLOGICAL BACKGROUND OF THE INVENTION

A control device for the electrical power supply for a semiconductor light source comprises, as is known to the person skilled in the art, a printed circuit board comprising at least one electronic component for controlling the electrical power supply. The printed circuit board is housed in a housing closed by a protective cap and said printed circuit board rests on said housing.

In order to effect a grounding of the printed circuit board, namely a connection of the printed circuit board to a ground plane, it is known practice to use a crimping pin or a screw. This crimping pin or this screw is respectively crimped or screwed at the centre of the printed circuit board and passes through said printed circuit board to the ground plane. One drawback with this prior art is that the printed circuit board can break under the combined effect of stresses originating from the crimping pin or screw, and from the housing, especially in the case where the housing is produced in a hard material (harder than aluminium for example).

In this context, the present invention aims to propose a solution that differs from the prior art, to effect a grounding compatible with a wider range of hardnesses of the housing material.

GENERAL DESCRIPTION OF THE INVENTION

To this end, the invention proposes a control device for the electrical power supply for a semiconductor light source for a light module, said control device comprising:
- a printed circuit board comprising at least one electronic component for controlling the electrical power supply;
- a housing suitable for accommodating said printed circuit board;
- a protective cap for closing said housing;
- a first ground belt arranged on a first face of said printed circuit board and a second ground belt arranged on a second face of said printed circuit board opposite the first face;
  - the housing comprising first points of contact with the second ground belt and said protective cap comprising second points of contact with said first ground belt, said housing and/or said protective cap comprising at least one protective curb for all or part of said first and second points of contact.

Thus, as will be seen in detail hereinbelow, for the grounding, the crimping pin has been replaced by a plurality of points of contact (the first and second points of contact) with two ground belts. By virtue of the first points of contact with the second ground belt and of the second points of contact with the first ground belt, a good grounding of the printed circuit board is assured. Furthermore, the first points of contact and the second points of contact ensure pinpoint support of the printed circuit board in the housing. The risks of deterioration of said printed circuit board in said housing are then limited. Moreover, said curb acts as a means for protecting these first points of contact and/or these second points of contact during the production of the housing and/or the production of the protective cap.

According to nonlimiting embodiments, the control device can further comprise one or more additional features out of the following:

According to a nonlimiting embodiment, said protective cap and/or said housing are made of Zamak.

According to a nonlimiting embodiment, the first points of contact and the second points of contact have a rounded form.

According to a nonlimiting embodiment, the first points of contact and the second points of contact are evenly distributed respectively over a first zone of contact and over a second zone of contact of said housing and of said protective cap with said printed circuit board.

According to a nonlimiting embodiment, the first points of contact and the second points of contact are moulded respectively with the housing and the protective cap.

According to a nonlimiting embodiment, said control device comprises at least one screw suitable for keeping said housing closed.

According to a nonlimiting embodiment, said housing and/or said protective cap comprises a primary chamfered zone.

According to a nonlimiting embodiment, said housing and/or said protective cap comprises a secondary chamfered zone.

According to a nonlimiting embodiment, there is a zone of overlap between said housing and said protective cap when said housing is closed by said protective cap.

According to a nonlimiting embodiment, said zone of overlap has a height greater than or equal to 1 mm.

According to a nonlimiting embodiment, the semiconductor light source forms part of a light-emitting diode.

Also proposed is a light module for a motor vehicle in which said light module comprises a semiconductor light source and a control device for the electrical power supply for said semiconductor light source according to any one of the preceding features.

BRIEF DESCRIPTION OF THE FIGURES

The invention and its various applications will be better understood on reading the following description and on studying the accompanying figures.

DESCRIPTION OF EMBODIMENTS OF THE INVENTION

The elements that are identical, by structure or by function, appearing in the various figures retain, unless otherwise stipulated, the same references.

The control device 10 according to the invention is described with reference to FIGS. 1 to 14. This control device 10 is adapted to control the electrical power supply of a semiconductor light source for a light module (not illustrated).

In a nonlimiting embodiment, the light module is a lighting and/or signalling device for a motor vehicle.

This light module comprises the control device 10 and at least one semiconductor light source.

In nonlimiting embodiments, the light module is adapted to ensure a photometric function:
 called "High Beam" to produce a high beam; and/or
 called "Low Beam" to produce, for example, a low beam; and/or
 called DRL, to produce a daytime running light; and/or
 called "Turn Indicator" to produce an indicator light.

In a nonlimiting embodiment, the semiconductor light source forms part of a light-emitting diode. A light-emitting diode should be understood to mean any type of light-emitting diodes, whether they be, in nonlimiting examples, LED (light-emitting diode), LEDs (light-emitting diodes), an OLED (organic LED) or an AMOLED (active-matrix-organic LED), or even an FOLED (flexible OLED).

A motor vehicle should be understood to be any type of motorized vehicle.

Figure 2:
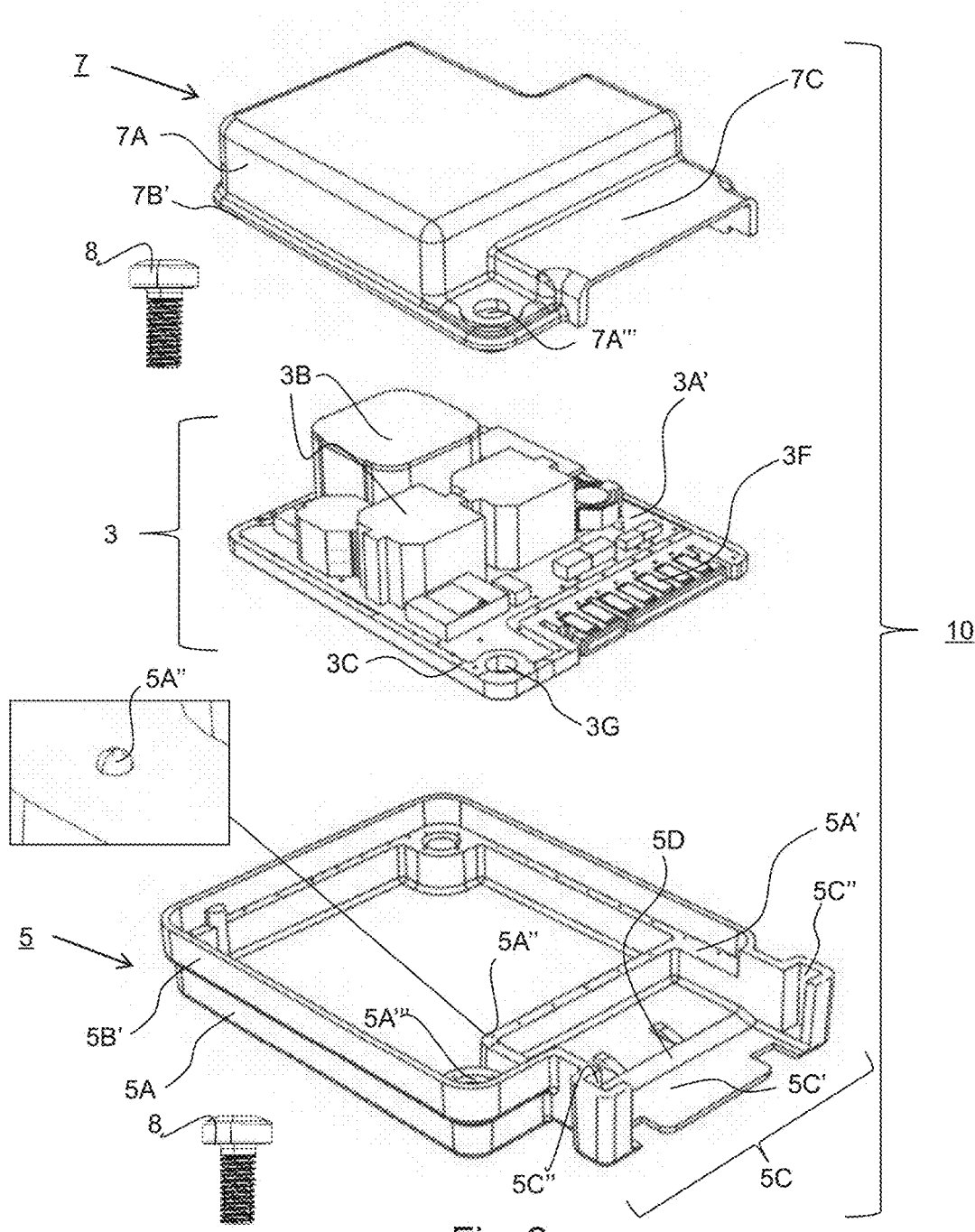
FIG. 2 represents an exploded view of the control device of FIG. 1 according to a nonlimiting embodiment.

As illustrated in FIG. 2, the control device 10 comprises:
 a printed circuit board 3;
 a housing 5;
 a protective cap 7.

The housing 5 and the protective cap 7 form the enclosure of the control device 10. They are adapted to cooperate with at least one screw 8. Said at least one screw 8 is thus adapted to join together the protective cap 7, the printed circuit board 3 and the housing 5, the printed circuit board 3 being sandwiched between the protective cap 7 and the housing 5.

In a nonlimiting embodiment, the control device 10 has a width less than or equal to 80 mm (millimeters), a length less than or equal to 80 mm, a thickness less than or equal to 20 mm. It will be noted that this size is a relatively small size for a control device 10.

As will be seen hereinbelow, the grounding is produced by first and second points of contact between the enclosure 5-7 of the control device 10 and the printed circuit board 3.

It will be recalled that a grounding is an electrical connection which is made between a printed circuit board, solid mechanical parts and the negative terminal of a battery of the motor vehicle. A grounding makes it possible to produce an EMC shielding for the electronic components of the control device 10.

The various elements of the control device 10 are described in detail hereinbelow.

Printed Circuit Board 3

As is illustrated more particularly in FIGS. 2 and 5 to 8, the printed circuit board 3 comprises:
 a baseplate 3A;
 at least one electronic component 3B;
 a first ground belt 3C and a second ground belt 3D;
 at least one connection track 3F.

The printed circuit board 3 is adapted to be housed in the housing 5.

The elements of the printed circuit board 3 are described in detail hereinbelow.

Baseplate 3A

In a nonlimiting embodiment, the baseplate 3A is composed of an epoxy resin sheet glued between copper layers. It comprises copper-plated tracks (not illustrated).

The printed circuit board 3, and more particularly the baseplate 3A of this printed circuit board 3, comprises a first face 3A' (also called top face) and a second face 3A" (also called bottom face) opposite the first face 3A'.

The baseplate 3A comprises an orifice 3G adapted for the passage of a screw 8. The screw 8 is adapted to fix the protective cap 7 onto the housing 5 such that the printed circuit board 3 is sandwiched between the protective cap 7 and the housing 5.

It will be noted that, on the first face 3A' and on the second face 3A" of the printed circuit board 3, the first ground belt 3C and the second ground belt 3D surround said orifice 3G.

In a nonlimiting embodiment, the printed circuit board 3, in particular its baseplate 3A, comprises metallized holes (also called vias) adapted to effect EMC interconnections in the printed circuit board 3. That makes it possible to produce a third Faraday cage (the other two being described later) for the copper-plated tracks of the printed circuit board 3 which can also emit a so-called EMC radiation.

Consequently, an EMC shielding for said copper-plated tracks is produced. This third Faraday cage thus makes it possible to protect the other members of the control motor vehicle against an EMC radiation from the copper-plated tracks, but it also makes it possible to protect the copper-plated tracks themselves against an EMC radiation from the other members of the motor vehicle.

Electronic Component 3B

At least one of the faces 3A', 3A" of the baseplate 3A comprises an electronic component 3B suitable for controlling the electrical power supply of a light source. In a nonlimiting embodiment, the printed circuit board 3 comprises a plurality of electronic components 3B. In nonlimiting embodiments, the electronic components 3B are a MOSFET transistor, a DC/DC converter, etc.

In a nonlimiting embodiment, an electronic component 3B is covered by a thermal paste 3H (illustrated in FIG. 7) suitable for transferring heat. The heat dissipation from said electronic component 3B is thus enhanced. It will be noted that the control device 10 comprises a thermal paste 3H associated with the electronic components 3B which heat up the most.

First Ground Belt 3C and Second Ground Belt 3D

The first ground belt 3C and the second ground belt 3D (cross-hatched zones in FIGS. 5 and 6) make it possible, with the first points of contact 5A" and the second points of contact 7A", to effect a grounding of the printed circuit board 3. The first ground belt 3C is arranged on the first face 3A' of the printed circuit board 3 and the second ground belt 3D is arranged on the second face 3A" of the printed circuit board 3. These are conductive parts.

In a nonlimiting embodiment, the first ground belt 3C and the second ground belt 3D are produced in one and the same material. In a nonlimiting variant embodiment, the material is tin. In a nonlimiting embodiment, the first ground belt 3C and the second ground belt 3D are thus tin-plated on the printed circuit board 3. It will be noted that, in the nonlimiting embodiment described later, where the housing 5 (and the first points of contact 5A") and the protective cap 7 (and the second points of contact 7A") are made of Zamak, there is a contact between a hard material (Zamak) and a softer material (tin). That makes it possible to have a better contact.

The first ground belt 3C and the second ground belt 3D are grounded via the negative terminal (not illustrated) of a battery of the motor vehicle. To this end, the negative terminal is connected to the board-edge connector 11 (illustrated in FIG. 9) which is itself linked to the first ground belt 3C and the second ground belt 3D.

The first ground belt 3C and the second ground belt 3D have substantially the same plot on the first face 3A' and on the second face 3A". More particularly, the first ground belt 3C and the second ground belt 3D extend respectively over the perimeter of the first face 3A' and over the perimeter of the second face 3A".

Connection Track 3F

The printed circuit board 3 comprises at least one connection track 3F. In a nonlimiting embodiment, it comprises a plurality of connection tracks 3F. A connection track 3F is adapted for the electrical power supply of the printed circuit board 3. The connection track 3F thus cooperates with a board-edge connector 11 (with a board-edge (also called "card edge") connector which comprises, as is known to the person skilled in the art, a jaw equipped with at least one contact adapted to come into contact with the connection track 3F of the printed circuit board 3 so as to connect the latter to a power supply cable bundle 13. It will be recalled that the power supply cable bundle 13 is adapted to power the control device 10, the latter redistributing the power supply power to the semiconductor light sources that it controls.

Figure 5:
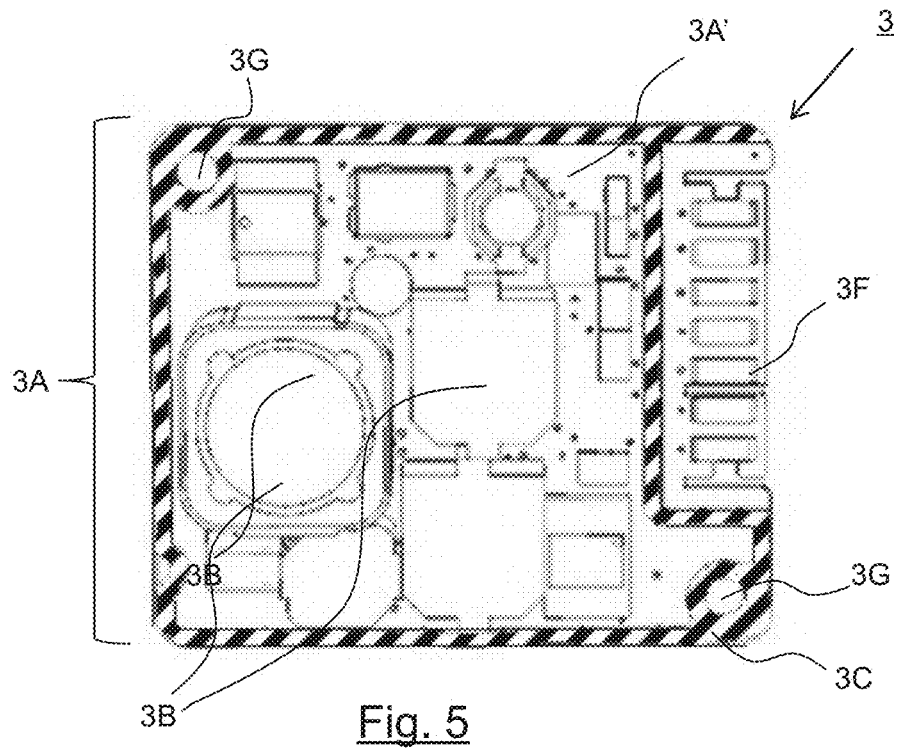
FIG. 5 schematically represents a plan view of a printed circuit board of the control device of FIGS. 1 and 2 according to a nonlimiting embodiment.
Figure 6:
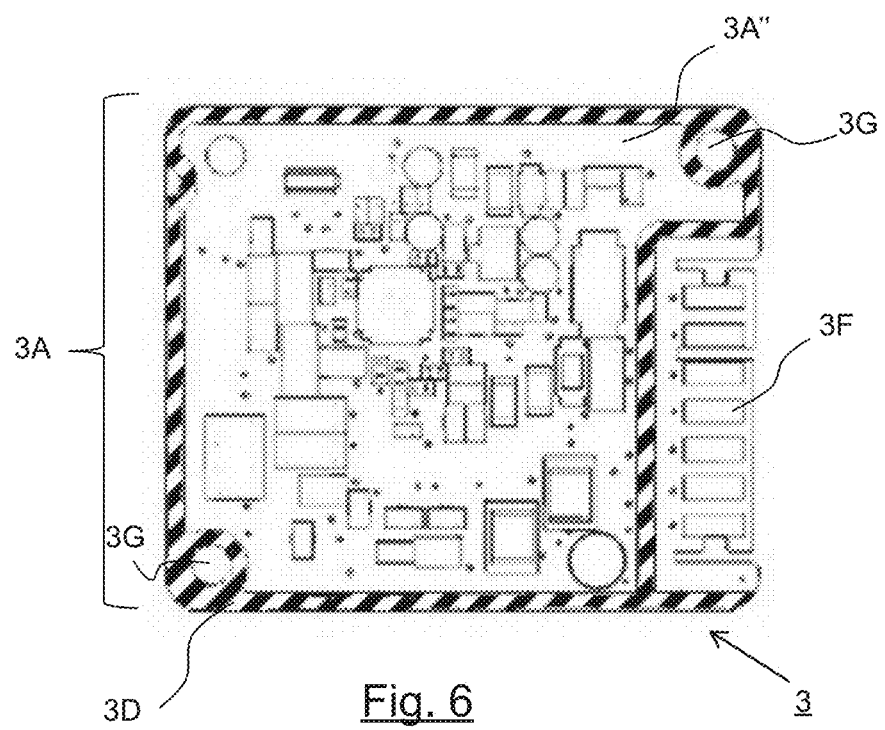
FIG. 6 schematically represents a bottom view of the printed circuit board of the control device of FIGS. 1 and 2 according to a nonlimiting embodiment.

In a nonlimiting embodiment, the connection track 3F is a metal track. As illustrated in FIGS. 5 and 6, it will be noted that, on the first face 3A' and on the second face 3A" of the printed circuit board 3, the first ground belt 3C and the second ground belt 3D circumvent the connection track 3F.

Housing 5

The housing 5 is adapted to thermally dissipate the heat given off by the electronic components 3B of the printed circuit board 3.

Moreover, it also has a function, with the protective cap 7, sandwiching the printed circuit board 3.

In a nonlimiting embodiment, the housing 5 is obtained during an injection process. In a nonlimiting embodiment, the housing 5 is made of Zamak. It will be noted that Zamak is an alloy of zinc, aluminium, magnesium and copper. This alloy is harder than aluminium. It will be noted that Zamak has a thermal dissipation capacity close to that of aluminium. In a nonlimiting embodiment, the injected Zamak has a thermal dissipation substantially equal to 110 watts/meter/kelvin like the injected aluminium.

For an injection production process, the Zamak makes it possible to obtain parts with smaller thicknesses than with aluminium.

Moreover, Zamak makes it possible to obtain parts by injection that are smaller, more precise, more complex and harder than with aluminium. In particular, the first points of contact 5A" obtained are more precise and more robust.

It will be noted that the production cycle time of a control device 10 made of Zamak is less than that of a control device 10 made of aluminium. Thus, in a nonlimiting example, the production cycle time for Zamak is substantially equal to 2 seconds whereas that for aluminium lies substantially between 30 and 40 seconds.

It will be noted that Zamak has a specific gravity of 6.8 whereas aluminium has a specific gravity of 2.7. Zamak is thus heavier than aluminium. However, since it is possible to obtain a housing 1.5 to 5 times less thick than with aluminium, the weight of the housing 5 reverts to the same as if it were produced in aluminium.

As is illustrated in FIGS. 1, 2, 4, 7-12, the housing 5 comprises:
 a first base body 5A;
 a first protective curb 5B';
 a reception zone 5C.

In a nonlimiting embodiment (not illustrated), the housing 5 comprises a primary chamfered zone to facilitate the closure of said housing 5 by the protective cap 7. The primary chamfered zone facilitates the placement of the protective housing of the protective cap 7 on the housing 5 and that thus makes it possible to produce a good mechanical mounting of the protective cap 7 and of the housing 5. In a nonlimiting variant embodiment, the first protective curb 5B' comprises said at least one primary chamfered zone adapted for the closure of the housing 5 by the protective cap 7.

In a nonlimiting embodiment, the housing 5 comprises a secondary chamfered zone 5D (illustrated in FIG. 4 for example) adapted to guide the board edge connector 11 and facilitate the placement thereof on the housing 5.

The elements of the housing 5 are described in detail hereinbelow.

First Base Body 5A

The first base body 5A of the housing 5 delimits the internal space in which the printed circuit board 3 is accommodated. The first base body 5A of the housing 5 comprises:
 a first zone of contact 5A' comprising first points of contact 5A";
 at least one tapped hole 5A'''.

The tapped hole 5A''' is adapted to receive the screw 8 for fixing the protective cap 7 onto the housing 5. It will be noted that first points of contact 5A" are arranged around this tapped hole 5A'''. In a nonlimiting embodiment represented in FIG. 4, the first base body 5A of the housing 5 comprises two tapped holes 5A'''.

The first zone of contact 5A' is adapted to receive the printed circuit board 3 in the housing 5. The first points of contact 5A" are distributed over the first zone of contact 5A'.

These first points of contact 5A" ensure pinpoint support for the printed circuit board 3 in the housing 5. The printed circuit board 3 in effect rests on them. In a nonlimiting embodiment illustrated in FIGS. 7 and 8, when the printed circuit board 3 is positioned in the housing 5, the first points of contact 5A" are in contact with the second ground belt 3D of the printed circuit board 3. The second ground belt 3D bears directly on the first points of contact 5A". Moreover, the first points of contact 5A" ensure a so-called EMC contact (with the printed circuit board 3) which makes it possible to avoid having the control device 10 emit electromagnetic waves which disturb the other members of the motor vehicle (such as the radio, the navigation system, etc., to give nonlimiting examples). Moreover, this so-called EMC contact also avoids having the control device 10 disturbed by an external radiated source, such as the other members of the motor vehicle which also emit electromagnetic waves.

This phenomenon which is well known to the person skilled in the art is called the problem of electromagnetic compatibility (EMC).

Thus, the first points of contact 5A" make it possible to produce an electrical connection between the printed circuit board 3 (via the second ground belt 3D) and the housing 5. The grounding is thus assured.

With the first points of contact 5A" being in contact with a conductive part (the second ground belt 3D) of the printed circuit board 3, the conductive part which is itself linked to the negative terminal of the battery, that makes it possible to create a first Faraday cage and consequently an EMC shielding for the electronic components 3B of the printed circuit board 3 which are located on its second face 3A". The electronic components 3B which emit a so-called EMC radiation are thus encapsulated in this first Faraday cage.

This first Faraday cage thus makes it possible to protect the other members of the motor vehicle against an EMC radiation from the electronic components 3B of the printed circuit board 3 which are located on its second face 3A", but it also makes it possible to protect these electronic components 3B themselves against an EMC radiation from the other members of the motor vehicle.

It will be noted that, without the presence of the first points of contact 5A", if the printed circuit board 3 (and therefore the second ground belt 3D) were to rest directly on the first zone of contact 5A' of the housing 5, there could be EMC leaks. In effect, there can be defects of flatness of the first zone of contact 5A' and/or of the second ground belt 3D which can cause the appearance of a zone of non-contact between two zones of contact. Because of this, a distance can exist between these two zones of contact potentially resulting in EMC leaks in the zone of non-contact. The presence of the first points of contact 5A" makes it possible to control the EMC problem because the distance P (also called pitch) between two points of contact 5A" can be determined accurately as explained below.

Figure 4:
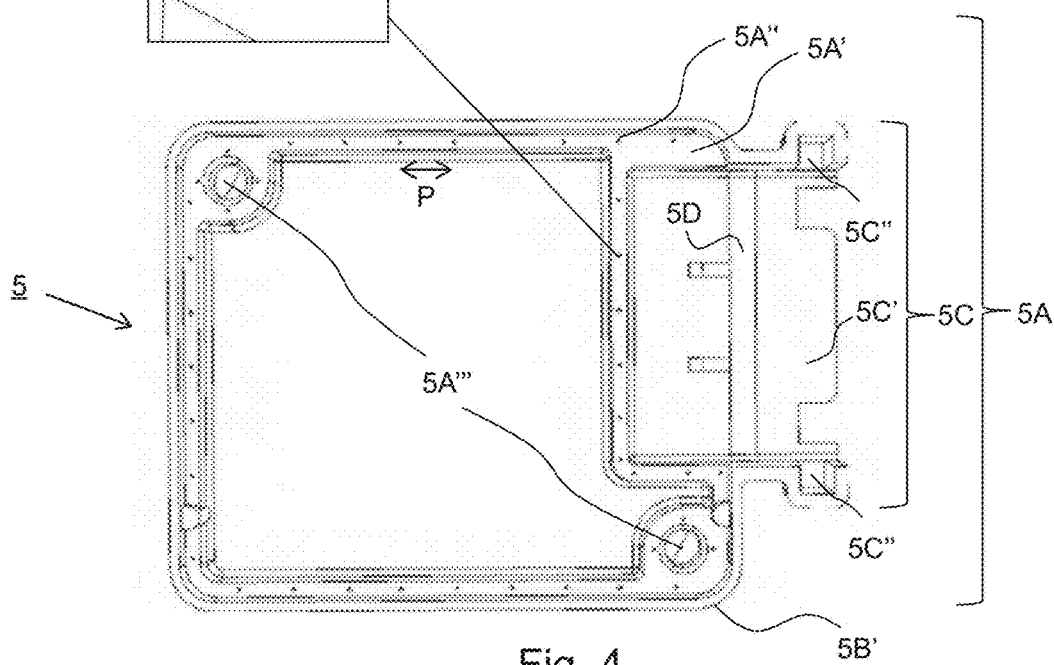
FIG. 4 schematically represents an internal view of a housing of the control device of FIGS. 1 and 2 according to a nonlimiting embodiment, said housing being adapted to be closed by the protective cap of FIG. 3.

In a nonlimiting embodiment illustrated in FIG. 4, the first points of contact 5A" have a rounded form. This is a form that is easy to mould. In a nonlimiting embodiment, the first points of contact 5A" are evenly distributed over the first zone of contact 5A'. That makes it possible to obtain an even bearing on the printed circuit board 3.

In a nonlimiting embodiment, the first points of contact 5A" extend over the perimeter of the housing 5 such that they are located facing the second ground belt 3D of the printed circuit board 3 when the latter is placed in the housing 5.

As is illustrated in FIG. 4, all or part of the first points of contact 5A" are thus aligned with one another with a constant pitch P. In a nonlimiting embodiment, the pitch P lies between 3 and 5 mm (millimeters).

The distribution of pressure is thus constant on the printed circuit board 3 upon the closure of the housing 5 by the protective cap 7. A balanced holding of the printed circuit board 3 in the housing 5 is thus promoted and the risks of deterioration of said printed circuit board 3 in said housing 5 are limited. In a nonlimiting embodiment, the first points of contact 5A" are moulded with the housing 5 and more particularly with the first zone of contact 5A'.

In a nonlimiting embodiment, the first points of contact 5A" are made of Zamak. The use of Zamak facilitates the moulding of the first points of contact 5A" with the desired geometry. Furthermore, with Zamak, the first points of contact 5A" exhibit an excellent hardness.

First Protective Curb 5B'

The first protective curb 5B' vertically extends the first base body 5A of the housing 5. As illustrated in the cross-sectional view of FIG. 7 and of FIG. 8, in a nonlimiting embodiment, there is a setback between the first base body 5A and the first protective curb 5B'. In this way, the space of the housing 5 in which the printed circuit board 3 is inserted is enlarged which facilitates the placement of said printed circuit board 3 in the first base body 5A.

The first protective curb 5B' is adapted to be fitted with the second protective curb 7B' of the protective cap 7. There is thus a zone of overlap 9 in the vertical direction (illustrated in FIG. 8, also called crossover) between the housing 5 and the protective cap 7 when said housing 5 is closed by said protective cap 7.

The first protective curb 5B' thus enhances the guiding of the protective cap 7 on the housing 5 and allows a closure of said housing 5 by said protective cap 7.

It will be noted that the zone of overlap 9 is adapted to conform to electrostatic discharge tests, called ESD tests. Electrostatic discharges originating from the outside can in fact disturb the printed circuit board 3. In a nonlimiting embodiment, the zone of overlap 9 has a height greater than or equal to 1 mm. This makes it possible to avoid an electrostatic discharge ranging up to 1000 volts.

Moreover, by virtue of the zone of overlap 9, the first protective curb 5B' is adapted to produce a complementary EMC protection barrier for the electronic components 3B of the printed circuit board 3, particularly for those situated on the second face 3A".

Finally, the first protective curb 5B' acts as a means of protection for all or part of the first points of contact 5A" during the production of the housing 5. During this production, the housing 5 is subjected, after its injection, to:

a so-called stalking operation in which the pieces of the control device 10 (the housing 5 and the protective cap 7) with the mould supply channel are separated from one another. In this stalking operation, they come into contact with one another which risks damaging the first points of contact 5A"

A so-called deburring operation, this deburring operation consists of a mechanical cleaning of the housing 5 and also allows the polishing thereof. To this end, the latter is placed in a rotary barrel which makes it possible to eliminate stray particles which could be detached from the housing 5 in the operation of the control device 10 and damage the printed circuit board 3 by creating short circuits. The first protective curb 5B' protects the first points of contact 5A" from the deburring operation, this operation otherwise risking tearing away the first points of contact 5A" or damaging them.

The first points of contact 5A" which are protected by the first protective curb 5B' are not removed or damaged and thus retain their form during the production of the housing 5. It will be noted that the first points of contact 5A" which are close to the first protective curb 5B' are protected by this protective curb 5B'.

In a nonlimiting embodiment illustrated in FIG. 4, a part of the first points of contact 5A" are protected by the first protective curb 5B'. They are situated at the bottom of said first protective curb 5B'. The other first points of contact 5A" which are not protected are those which are located facing the board-edge connector 11 when the latter is installed. Obviously, in another nonlimiting embodiment, provision can be made to protect them also.

It will be noted that, after the deburring operation, in a nonlimiting embodiment, the housing 5 undergoes a cleaning operation which makes it possible to remove the grease used for the mould-stripping operation.

Reception Zone 5C

The reception zone 5C is adapted to receive a board-edge connector 11.

This reception zone 5C comprises:
a reception part 5C';
at least one vertical runner 5C".

The reception part 5C' of the reception zone 5C is adapted to receive the board-edge connector 11. As is illustrated in FIGS. 9 to 12, the board-edge connector 11 comes into contact with the connection track 3F of the printed circuit board 3 for the supply of electrical power to said printed circuit board 3. As has already been specified, the board-edge connector 11 is electrically powered by the power supply cable bundle 13.

The vertical runner 5C" is adapted to receive a blocking piece 15 of the board-edge connector 11 on the printed circuit board 3. In a nonlimiting embodiment illustrated in FIGS. 1, 2, 9-12, the reception zone 5C comprises two vertical runners arranged facing one another. The placement and the holding of the locking piece 15 in the control device 10 is thus improved.

Protective Cap 7

The protective cap 7 is adapted to thermally dissipate the heat given off by the electronic components 3B of the printed circuit board 3.

Moreover, it also serves, with the housing 5, to sandwich the printed circuit board 3.

The protective cap 7 is adapted to close the housing 5. In a nonlimiting embodiment, the protective cap 7 is obtained during an injection production method.

In a nonlimiting embodiment, the protective cap 7 is made of Zamak. It is thus possible to obtain a protective cap 7 of a form that is more complex and harder than with aluminium. In particular, the second points of contact 7A" obtained are more accurate and more robust.

It is possible to obtain a protective cap 7 that is less thick than with aluminium. The weight of the protective cap 7 amounts to the same as if it were produced in aluminium.

As is illustrated in FIGS. 1, 2, 3, 7-12, the protective cap 7 comprises:
a second base body 7A;
a second protective curb 7B';
a protection part 7C.

Figure 8:
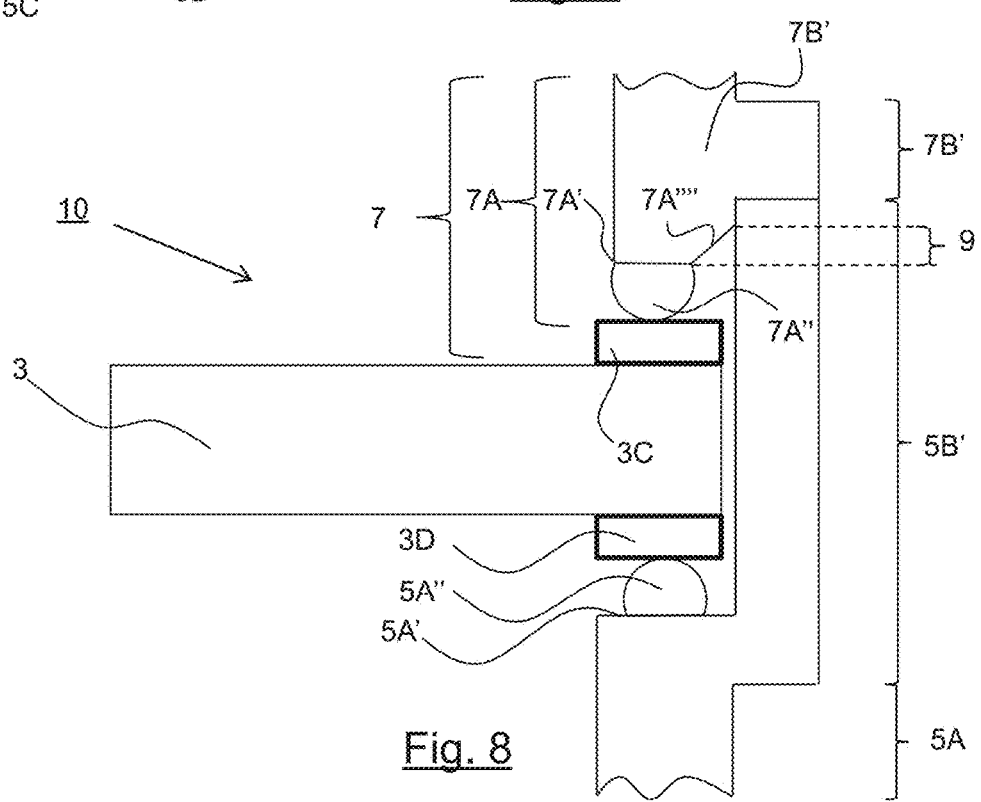
FIG. 8 is an enlarged view of a part of the cross-sectional view of FIG. 7.
Figure 9:
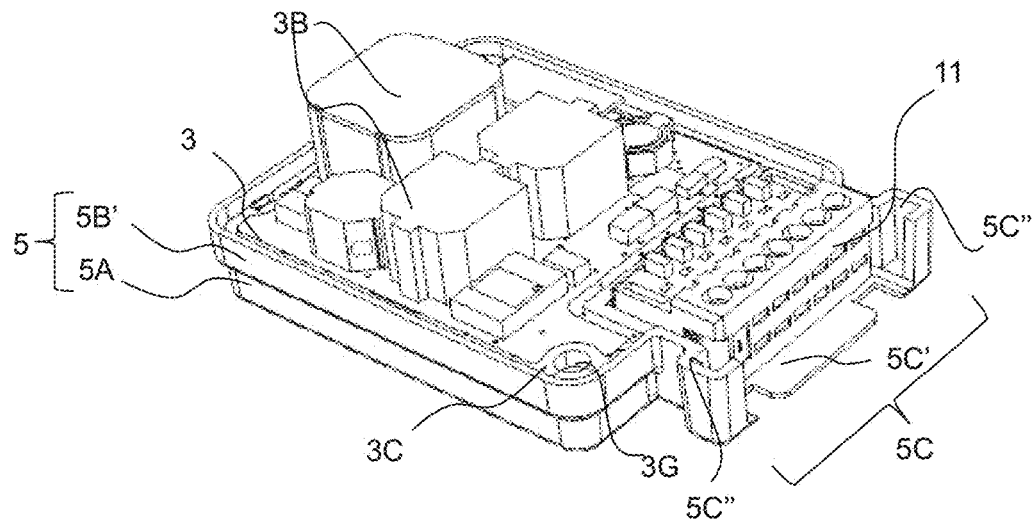
FIG. 9 represents a perspective view of the control device of FIGS. 1 and 2 without its protective cap, said control device cooperating with a board-edge connector according to a nonlimiting embodiment.

In a nonlimiting embodiment, the protective cap 7 comprises at least one primary chamfered zone 7A"" for the closure of said housing 5 by the protective cap 7. The primary chamfered zone 7A"" facilitates the placement of the protective cap 7 on the housing 5 that thus makes it possible to produce a good mechanical mounting of the protective cap 7 and of the housing 5. In a nonlimiting variant embodiment, the second protective curb 7A' comprises said at least one primary chamfered zone 7A"". The primary chamfered zone 7A"" extends from the second zone of contact 7A" to the outside of the protective cap 7. The primary chamfered zone 7A"" facilitates the placement of the protective cap 7 on the housing 5. In FIG. 8, the primary chamfered zone 7A" is totally positioned in the housing 5, when the housing 5 is closed by the protective cap 7.

In the same way as for the housing 5, in a nonlimiting embodiment, the protective cap 7 comprises at least one secondary chamfered zone 7D (illustrated in FIG. 3 for example) adapted to guide the board-edge connector 11 and facilitate the placement thereof under the protective cap 7.

The elements of the protective cap 7 are described in detail hereinbelow.

Second Base Body 7A

The second base body 7A of the protective cap 7 delimits a space adapted to cover the printed circuit board 3 housed in the housing 5. The second base body 7A comprises:
a first zone of contact 7A' comprising second points of contact 7A";
at least one orifice 7A'".

The orifice 7A'" is adapted to allow the screw 8 to pass for the fixing of the protective cap 7 on the housing 5. In a nonlimiting embodiment represented in FIG. 3, the second base body 7A of the protective cap 7 comprises two orifices 7A'".

The second zone of contact 7A' is adapted to come to bear on the printed circuit board 3 in the housing 5. The second points of contact 7A" are distributed over the second zone of contact 7A'.

These second points of contact 7A" ensure the pinpoint holding of the printed circuit board 3 in the housing 5. In a nonlimiting embodiment illustrated in FIG. 7, when the protective cap 7 is positioned on the housing 5, the second points of contact 7A" are in contact with the first ground belt 3C of the printed circuit board 3. They bear directly on this first ground belt 3C.

Moreover, the second points of contact 7A" ensure a so-called EMC contact (with the printed circuit board 3) which makes it possible to avoid having the control device 10 emit electromagnetic waves which disturbed the other members of the motor vehicle (such as the radio, the navigation system, etc., to give a few nonlimiting examples). Moreover, this so-called EMC contact also avoids having the control device 10 disturbed by an external radiated source, such as the other members of the motor vehicle which also emit electromagnetic waves.

Thus, the second points of contact 7A" make it possible to produce an electrical connection between the printed circuit board 3 (via the first ground belt 3C) and the protective cap 7. The grounding is thus assured.

With the second points of contact 7A" being in contact with a conductive part (the first ground belt 3C) of the printed circuit board 3, a conductive part which is itself linked to the negative terminal of the battery, that makes it possible to create a second Faraday cage and consequently an EMC shielding for the electronic components 3B of the printed circuit board 3 which are located on its first face 3A'. The electronic components 3B which emit an EMC radiation are thus encapsulated in this second Faraday cage. This second Faraday cage thus makes it possible to protect the other members of the motor vehicle against an EMC radiation from the electronic components 3B of the printed circuit board 3 which are located on its first face 3A', but it also makes it possible to protect these electronic components 3B themselves against an EMC radiation from the other members of the motor vehicle.

It will be noted that, without the presence of the second points of contact 7A", if the printed circuit board 3 (and therefore the first ground belt 3C) were to rest directly on the second zone of contact 7A' of the protective cap 7, there could be EMC leaks. In effect, there may be defects of flatness of the second zone of contact 7A' and/or of the first ground belt 3C which can cause the appearance of a zone of non-contact between two zones of contact.

Figure 3:
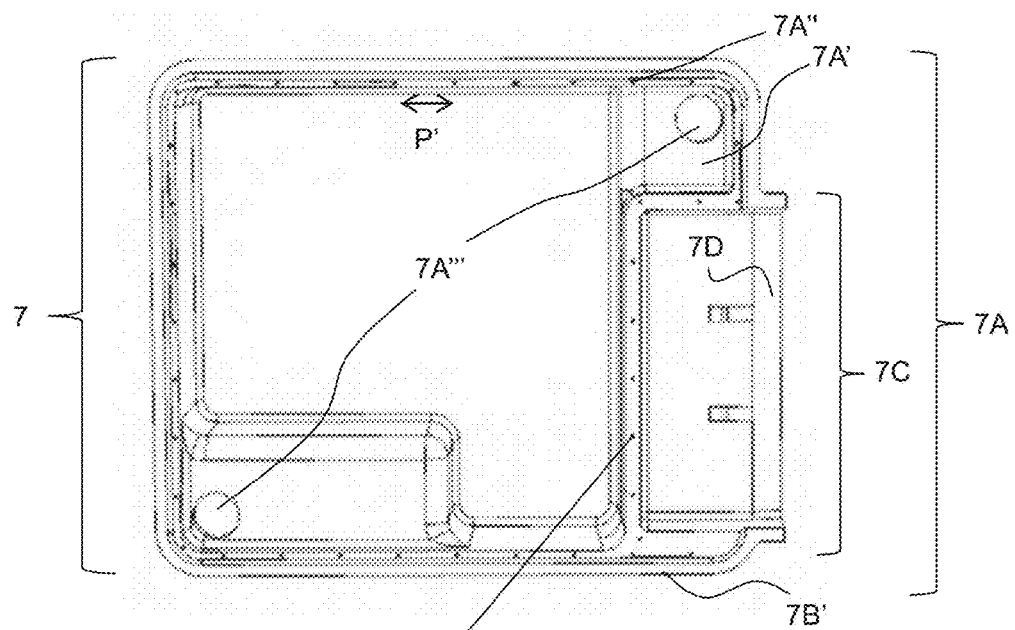
FIG. 3 schematically represents an internal view of a protective cap of the control device of FIGS. 1 and 2 according to a nonlimiting embodiment.

In a nonlimiting embodiment illustrated in FIG. 3, the second points of contact 7A" have a rounded form. This is a form that is easy to mould. In a nonlimiting embodiment, the second points of contact 7A" are evenly distributed over the second zone of contact 7A'.

In a nonlimiting embodiment, the second points of contact 7A" extend over the perimeter of the protective cap 7 such that they are located facing the first round belt 3C of the printed circuit board 3 when the latter is located in the housing 5 and the protective cap 7 is placed on the housing 5 to close it.

As is illustrated in FIG. 3, all or part of the second points of contact 7A" are thus aligned with one another with a constant pitch P'. In a nonlimiting example, the pitch P' lies between 3 and 5 mm (millimeters). The distribution of pressure is thus constant on the printed circuit board 3 upon the closure of the housing 5 by the protective cap 7.

A balanced holding of the printed circuit board 3 in the housing 5 is thus promoted. In a nonlimiting embodiment, the second points of contact 7A" are moulded with the protective cap 7 and more particularly with the second zone of contact 7A'.

In a nonlimiting embodiment, the second points of contact 7A" are made of Zamak. The use of Zamak facilitates the moulding of the second points of contact 7A" with the desired geometry. Furthermore, with Zamak, the second points of contact 7A" exhibit an excellent hardness.

Thus, by virtue of the first points of contact 5A" cooperating with the second ground belt 3D and of the second points of contact 7A" cooperating with the first ground belt 3C, a grounding is assured between the metal enclosure of the control device 10 (formed by the housing 5 and the protective cap 7) and the electrical circuit of the control device 10, namely the printed circuit board 3. The housing 5, the protective cap 7 and the printed circuit board 3 are all linked to the same ground so as to produce an EMC shielding. This enhances the quality of the EMC shielding.

Second Protective Curb 7B'

The second protective curb 7B' extends vertically from the second base body 7A. The second protective curb 7B' is adapted to be fitted with the first protective curb 5B' of the housing 5. There is thus a zone of overlap 9 between the housing 5 and the protective cap 7 as described previously. By virtue of the zone of overlap 9, the second protective curb 7B' is adapted to produce a complementary EMC protection barrier for the electronic components 3B of the printed circuit board 3, in particular for those situated on the first face 3A'.

Finally, as for the case of the first protective curb 5B' with all or part of the first points of contact 5A", the second protective curb 7B' acts as a means of protection for all or part of the second points of contact 7A" during the production of the protective cap 7. In effect, during this production, the protective cap 7 is also subjected, like the housing 5, after its injection, to the stalking operation seen previously and to the deburring operation seen previously. The second points of contact 7A" which are protected by the second protective curb 7B' are not removed or damaged and thus retain their form during the production of the protective cap 7.

In a nonlimiting embodiment illustrated in FIG. 3, a part of the second points of contact 7A" are protected by the second protective curb 7B'. They are situated at the bottom of said second protective curb 7B'. The other second points of contact 7A" which are not protected are those which are located facing the board-edge connector 11 when the latter is installed. Obviously, in another nonlimiting embodiment, provision can be made to protect them also.

It will be noted that, after the deburring operation, in a nonlimiting embodiment, the protective cap 7 undergoes a cleaning operation which makes it possible to remove the grease used for the mould-stripping operation.

Protection Part 7C

Figure 1:
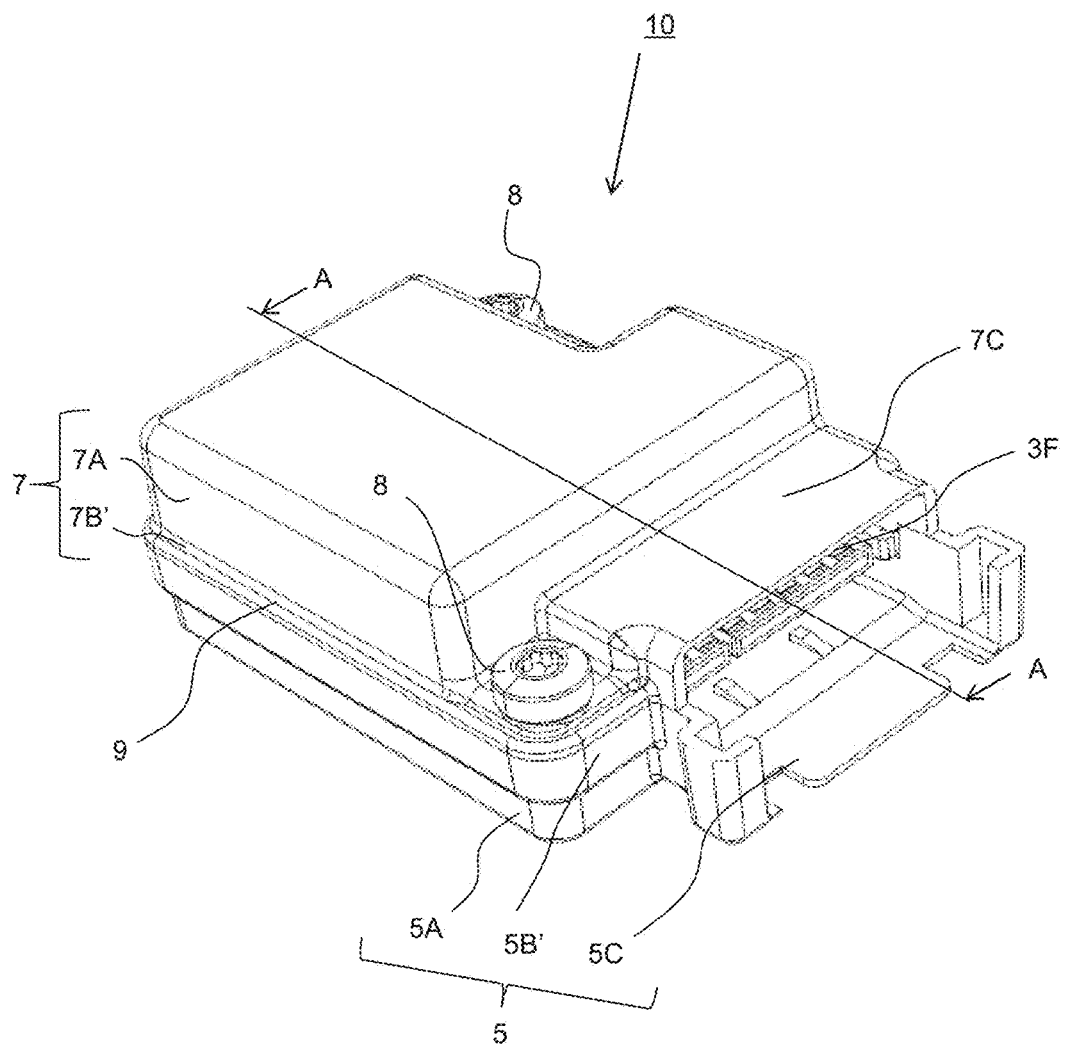
FIG. 1 represents a perspective view of a control device for the electrical power supply for a semiconductor light source according to a nonlimiting embodiment of the invention.
Figure 7:
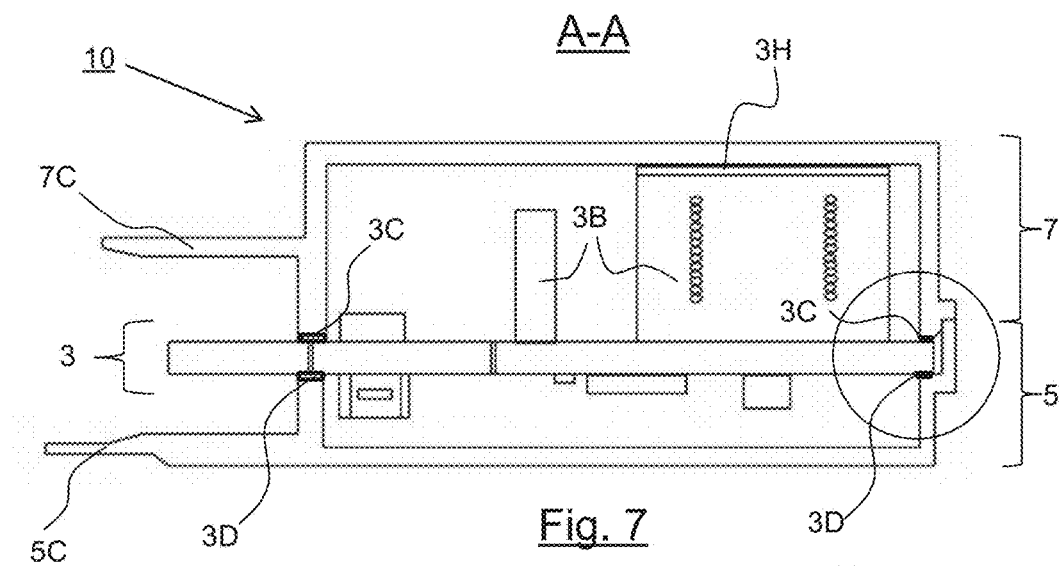
FIG. 7 schematically represents a cross-sectional view of the control device according to a nonlimiting embodiment, according to a cross-section A-A of FIG. 1.

The protection part 7C is adapted to cover the connection track 3F of the printed circuit board 3. For that, it extends horizontally protruding from the second base body 7A of the protective cap 7, as illustrated in FIG. 1 or 7.

Screw

The screw 8 is adapted to fix the protective cap 7 onto the housing 5. It holds the protective cap 7 on the housing 5.

The head of the screw 8 is adapted to rest on the protective cap 7 when the protective cap 7 closes the housing 5. It is thus adapted to keep said housing 5 closed. The threading of the screw 8 is adapted to be housed in the tapped hole 5A" of the housing 5.

The screw 8 ensures the pressing of the printed circuit board 3 in the housing 5 and thus ensures that the first points of contact 5A" of the housing 5 and the second points of contact 7A" of the protective cap 7 are indeed in contact with, respectively, the second ground belt 3D and the first ground belt 3C of the printed circuit board 3.

Mounting Method

The method for mounting the control device 10 is described with reference to FIGS. 10 to 14.

Figure 10:
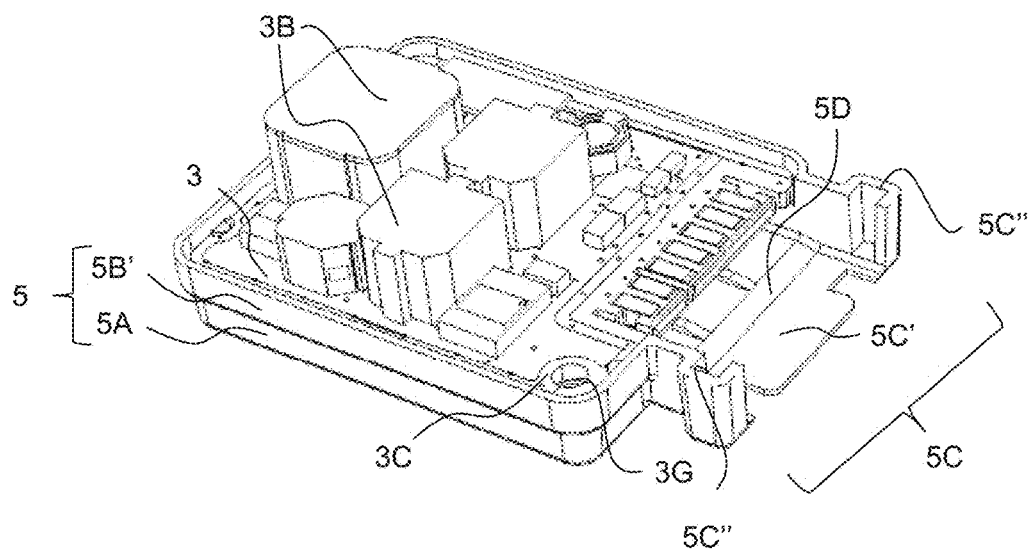
FIG. 10 represents the control device of FIG. 9 without the board-edge connector.

Initially, the printed circuit board 3 is inserted into the housing 5 (FIG. 10). The second face 3A" of the printed circuit board 3 then rests on the first zone of contact 5A' of the housing 5 and the first points of contact 5A" are in contact with the second ground belt 3D.

Figure 11:
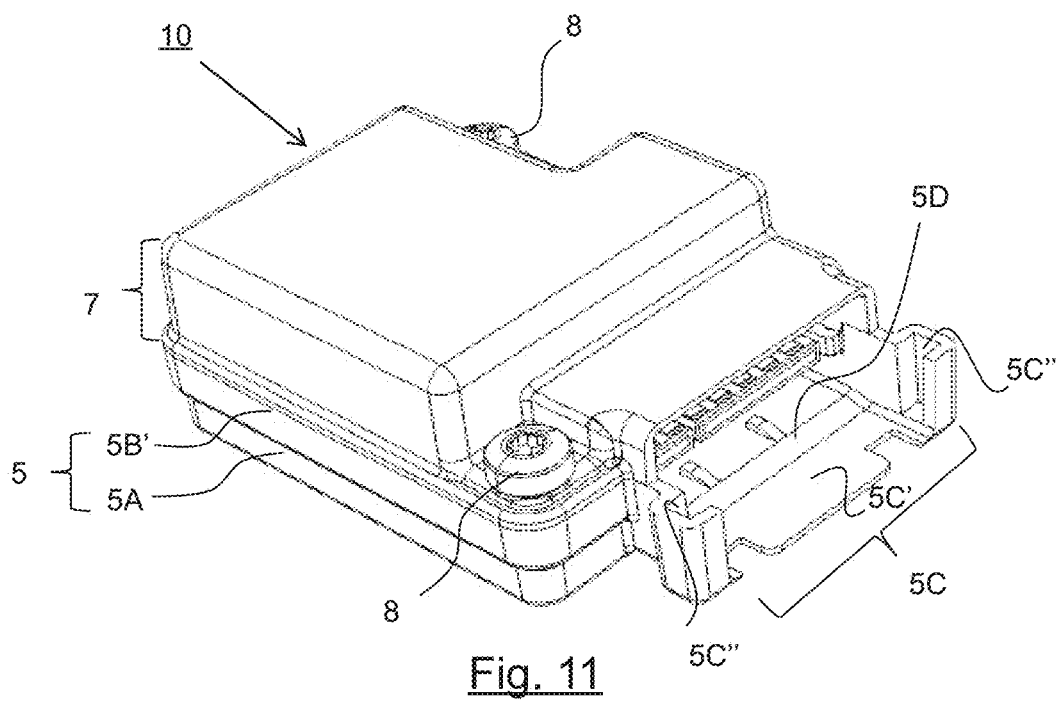
FIG. 11 represents a perspective view of the control device of FIGS. 1 and 2.

Secondly, the protective cap 7 is added to the housing 5 (FIG. 11). The second points of contact 7A" of the protective cap come into contact with the first ground belt 3C. The zone of overlap 9 is formed between the housing 5 and the protective cap 7. Then, the screw 8 is inserted into the orifice 7A''' of the protective cap 7 and into the orifice 3G of the printed circuit board 3 and it is screwed into the tapped hole 5A" of the housing 5 (FIG. 11).

Figure 12:
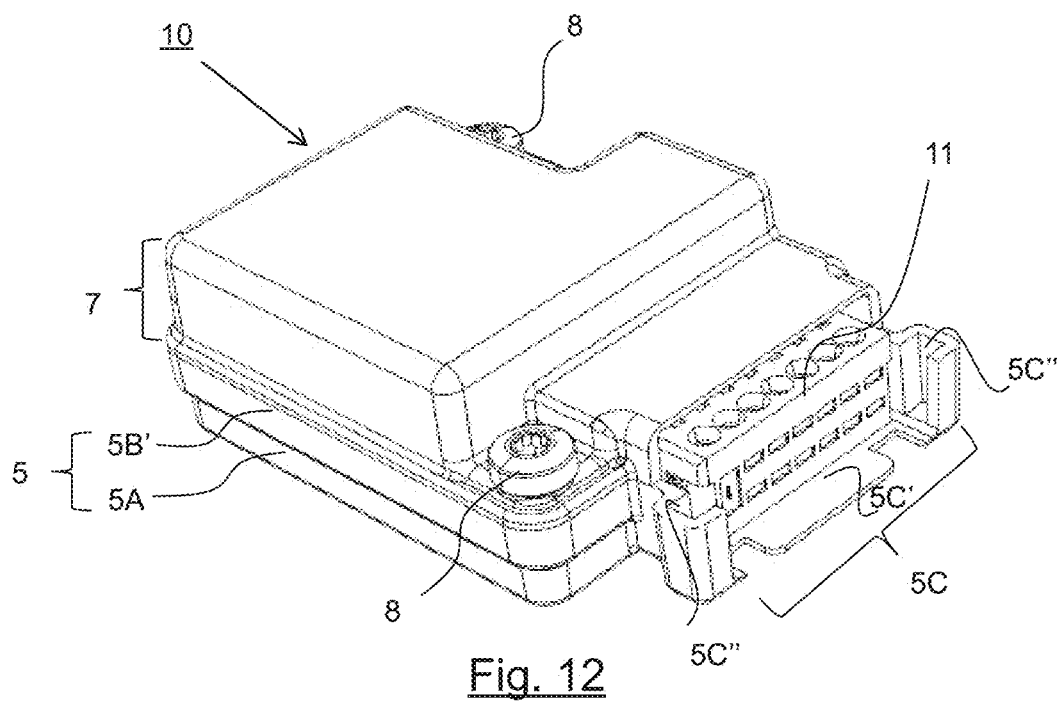
FIG. 12 represents the control device of FIG. 11, said control device cooperating with a board-edge connector according to a nonlimiting embodiment.
Figure 13:
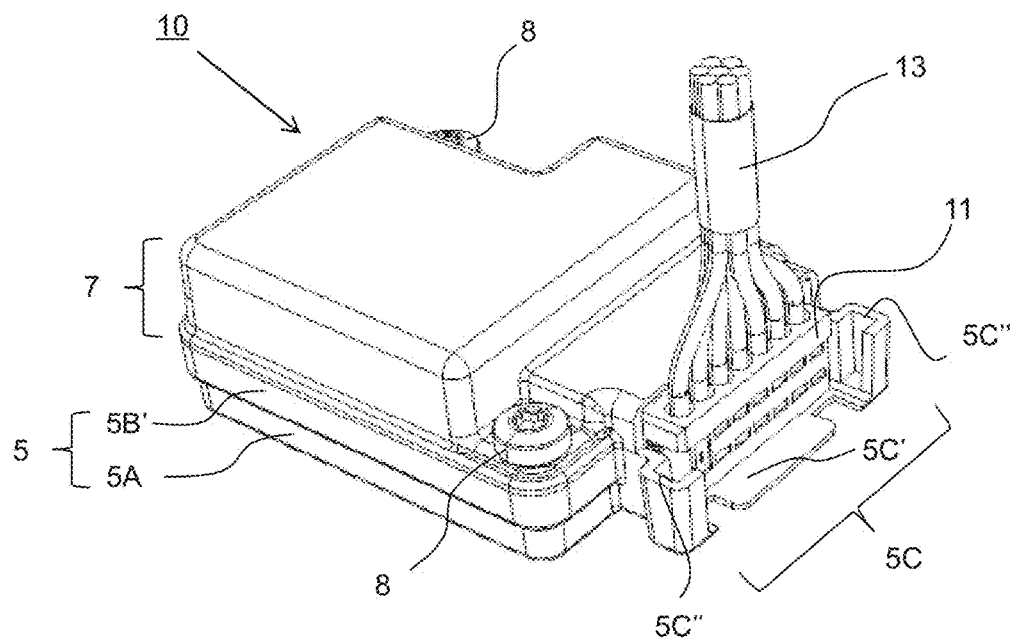
FIG. 13 represents the control device of FIG. 12, said control device cooperating also with a power supply cable bundle according to a nonlimiting embodiment.

Thirdly, the board-edge connector 11 is placed on the reception zone 5C of the housing 5. The board-edge connector 11 then comes to be attached to the printed circuit board 3 by its jaw (FIG. 12). The board-edge connector 11 is partly under the protection part 7C of the protective cap 7. The power supply cable bundle is then linked to the board-edge connector 11 (FIG. 13).

Figure 14:
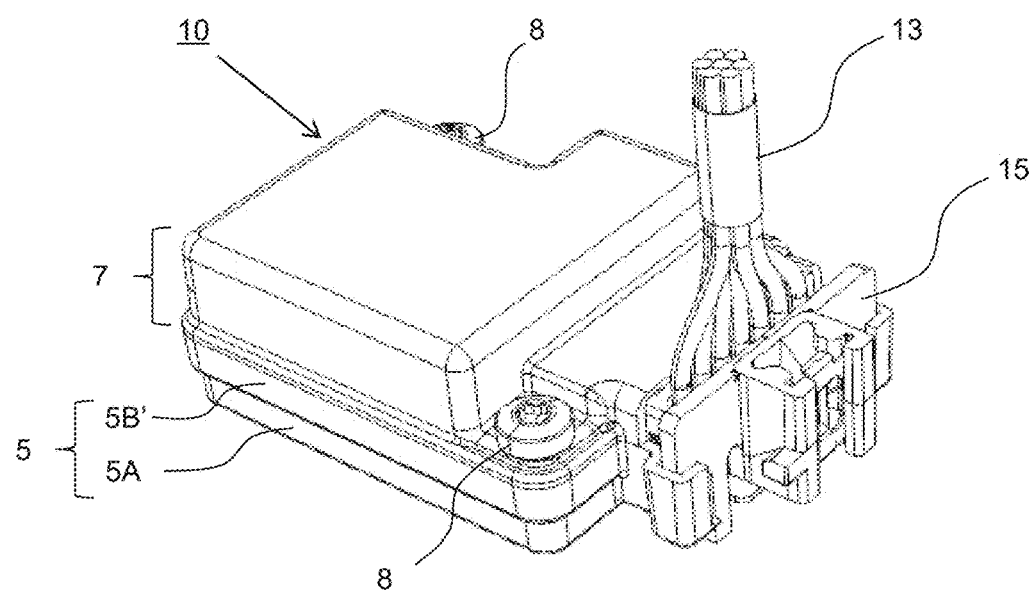
FIG. 14 represents the control device of FIG. 13 in which the power supply cable bundle is immobilized in the board-edge connector by an immobilizing piece according to a nonlimiting embodiment.

Finally, the blocking piece 15 is slipped into the vertical runner 5C" to block the board-edge connector 11 in the control device 10 (FIG. 14).

The control device 10 is thus assembled.

After its parts are assembled, the control device 10 is mounted on the light module.

Obviously, the description of the invention is not limited to the embodiments described above.

Thus, in another nonlimiting embodiment, the housing 5 and the protective cap 7, as well as their first points of contact 5A" and their second points of contact 7A" are in a material that is harder or softer than Zamak.

Thus, in another nonlimiting embodiment, the housing 5 and the protective cap 7 are made of aluminium, as are their first points of contact 5A" and their second points of contact 7A".

Thus, in another nonlimiting embodiment, the number of screws 8 is greater than or equal to two.

Thus, in another nonlimiting embodiment, the production of the control device 10 does not include a stalking operation. That is the case when the housing 5 and the protection cap 7 are not in the same mould.

Thus, the invention described offers in particular the following advantages:

- it offers an architecture different from that of the prior art with the crimping pin;
- it eliminates assembly steps (namely the crimping of a crimping pin) since the grounding is now done as the closing of the housing 5;
- it reduces the risks of deterioration of the electronic components of the printed circuit board 3;
- the use of Zamak makes it possible to reduce the production costs of the control device 10, particularly when the latter is of relatively small size because Zamak injection is less expensive than aluminium injection;
- Zamak injection allows more accurate and more technical parts with movements that are easier to implement in the mould, as well as the assurance of having harder points of contact with the desired geometry;
- it makes it possible to limit the EMC emissions of the control device 10;
- it makes it possible to protect the control device 10 against the EMC emissions originating from other members of the motor vehicle;
- the first and second points of contact 5A", 7A" are protected respectively by at least one protective curb 5B', 7B' in each operation of production of the housing 5 and of the protective cap 7, protective curbs which serve also as EMC barrier;
- the rest of the EMC sealing of the control device 10 is assured by the overlapping of the housing 5 by the protective cap 7.

The invention claimed is:

1. A control device for controlling electrical power supply for a semiconductor light source of a light module, the control device comprising:
   a printed circuit board including at least one electronic component configured to control the electrical power supply;
   a housing configured to accommodate said printed circuit board;
   a protective cap configured to close said housing; and
   a first ground belt arranged on a first face of said printed circuit board and a second ground belt arranged on a second face of said printed circuit board opposite the first face,
   the housing including first points of contact which are in contact with the second ground belt and said protective cap including second points of contact which are in contact with said first ground belt, said housing or said protective cap including at least one protective curb for all or part of said first and second points of contact, said first points of contact and said second points of contact having a rounded form.

2. The control device according to claim 1, wherein said protective cap or said housing is made of Zamak.

3. The control device according to claim 2, wherein said first points of contact and said second points of contact are evenly distributed respectively over a first zone of contact and over a second zone of contact of said housing and of said protective cap.

4. The control device according to claim 2, wherein said first points of contact and said second points of contact are moulded respectively with said housing and said protective cap.

5. The control device according to claim 2, further comprising:
   at least one screw configured to keep said housing closed.

6. The control device according to claim 2, wherein said housing or said protective cap includes a primary chamfered zone.

7. The control device according to claim 2, further comprising:
   a zone of overlap between said housing and said protective cap when said housing is closed by said protective cap.

8. The control device according to claim 2, wherein the semiconductor light source forms part of a light-emitting diode.

9. The light module for a motor vehicle:
   comprising:
   the semiconductor light source and the control device according to claim 2.

10. The control device according to claim 2, wherein the printed circuit board includes at least one connection track, and the first ground belt and the second ground belt circumvent the at least one connection track.

11. The control device according to claim 1, wherein said first points of contact and said second points of contact are evenly distributed respectively over a first zone of contact and over a second zone of contact of said housing and of said protective cap.

12. The control device according to claim 1, wherein said first points of contact and said second points of contact are moulded respectively with said housing and said protective cap.

13. The control device according to claim 1, further comprising:
   at least one screw configured to keep said housing closed.

14. The control device according to claim 1, wherein said housing or said protective cap includes a primary chamfered zone.

15. The control device according to claim 1, said housing or said protective cap includes a secondary chamfered zone.

16. The control device according to claim 1, further comprising:
   a zone of overlap between said housing and said protective cap when said housing is closed by said protective cap.

17. The control device according to claim 16, wherein said zone of overlap has a height greater than or equal to 1 mm.

18. The control device according to claim 1, wherein the semiconductor light source forms part of a light-emitting diode.

19. The light module for a motor vehicle, comprising:
   the semiconductor light source and the control device according to claim 1.

20. The control device according to claim 1, wherein the printed circuit board includes at least one connection track, and the first ground belt and the second ground belt circumvent the at least one connection track.

* * * * *